United States Patent [19]

Wu

[11] Patent Number: 5,286,677
[45] Date of Patent: Feb. 15, 1994

[54] METHOD FOR ETCHING IMPROVED CONTACT OPENINGS TO PERIPHERAL CIRCUIT REGIONS OF A DRAM INTEGRATED CIRCUIT

[75] Inventor: Kuo-Chang Wu, Taichung, Taiwan

[73] Assignee: Industrial Technology Research Institute, Hsinchu, Taiwan

[21] Appl. No.: 57,884

[22] Filed: May 7, 1993

[51] Int. Cl.$^5$ .............................................. H01L 21/44
[52] U.S. Cl. ................................... 437/195; 437/49;
437/978; 156/644; 148/DIG. 43
[58] Field of Search ......................... 437/49, 195, 978;
156/644; 148/DIG. 43

[56] References Cited

U.S. PATENT DOCUMENTS

| | | | |
|---|---|---|---|
| 5,006,484 | 4/1991 | Harada | 437/978 |
| 5,066,612 | 11/1991 | Ohba et al. | 437/978 |
| 5,110,752 | 5/1992 | Lu | 437/47 |
| 5,126,916 | 6/1992 | Tseng | 437/48 |

FOREIGN PATENT DOCUMENTS 62-274641  11/1987  Japan .................................. 437/978

*Primary Examiner*—Brian E. Hearn
*Assistant Examiner*—Laura M. Holtzman
*Attorney, Agent, or Firm*—George O. Saile

[57] ABSTRACT

A method is described for etching contact openings through first and second interlevel dielectric layers covering the peripheral circuits of a DRAM integrated circuit to be electrically contacted in a semiconductor wafer is described. There is provided within and over the semiconductor wafer DRAM integrated circuit including peripheral circuits to be electrically contacted. A first conductive layer is formed over the DRAM integrated circuit and the layer is patterned. A first interlevel dielectric layer is formed over the first conductive layer which has been patterned. The first interlevel layer is composed of in the order from the first conductive layer of a silicon oxide layer and a borophosphosilicate layer. A second conductive layer is formed over the first interlevel dielectric layer and the second conductive layer is patterning said second conductive layer. A second interlevel dielectric layer is formed over the exposed second conductive layer and first interlevel dielectric. The second interlevel layer is composed of in the order from the second conductive layer of a borophosphosilicate layer and a silicon oxide layer. The openings through the first and second interlevel dielectric layers are etched to electrically contact regions in the peripheral circuits. The result due to the order of the interlevel dielectric layers the openings have an improved and positive slope characteristic.

16 Claims, 2 Drawing Sheets

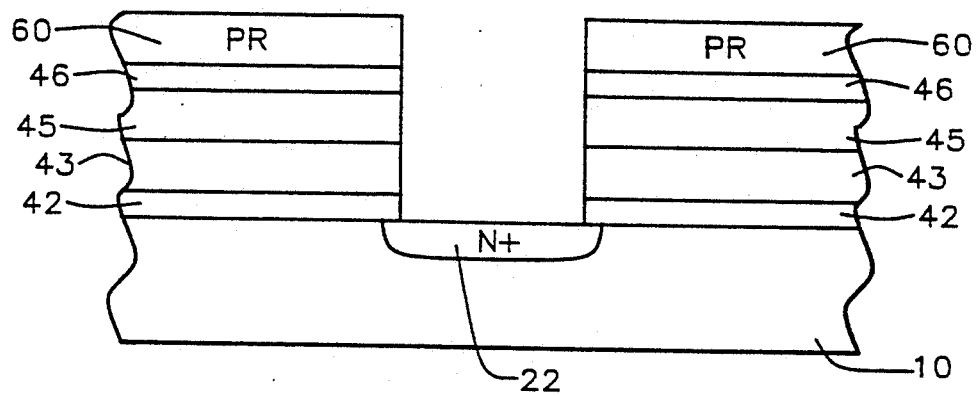
FIG. 3
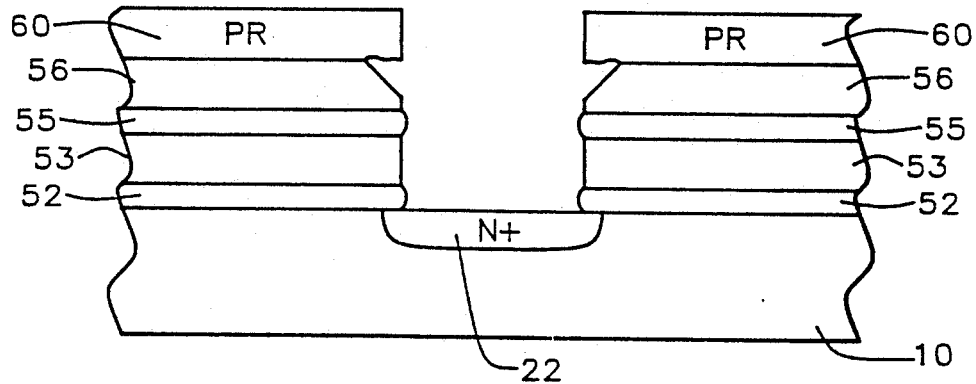
FIG. 4 Prior Art
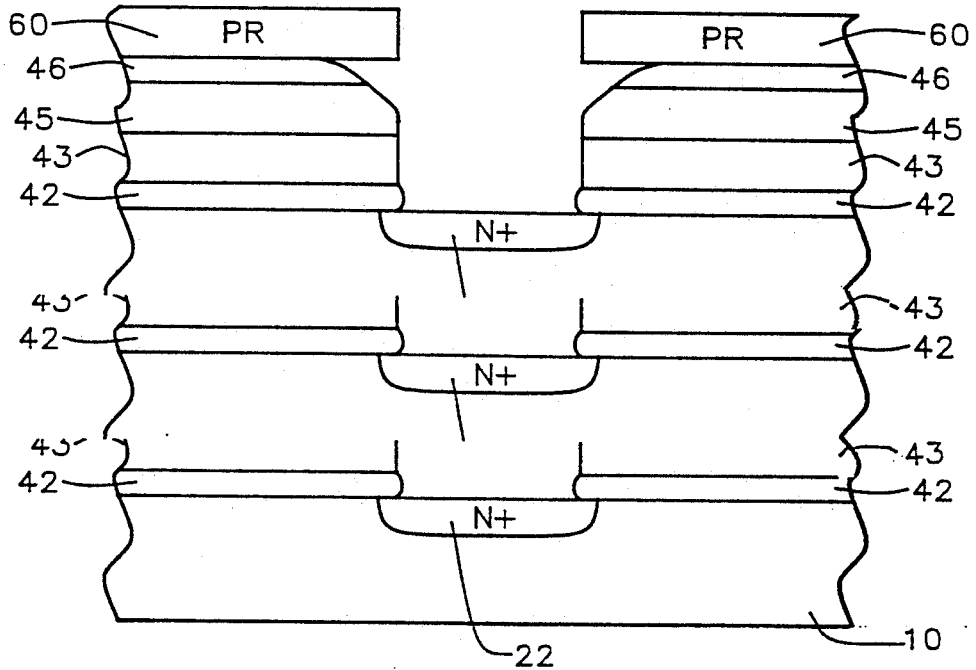

METHOD FOR ETCHING IMPROVED CONTACT OPENINGS TO PERIPHERAL CIRCUIT REGIONS OF A DRAM INTEGRATED CIRCUIT

BACKGROUND OF THE INVENTION (1) Field of the Invention

The invention relates to a method of etching improved contact openings to DRAM peripheral circuits and more particularly to the formation of the dielectric interlevel layers in such a way to allow the etching of contact openings having superior slope characteristics.

(2) Description of the Prior Art

It is recognized in the integrated circuit technology that contact openings must have a satisfactory slope which allows the subsequent complete filling of the openings with metal for proper electrical contact of the regions in the semiconductor wafer. The problem is becoming increasingly more difficult as the feature size, that is the width of the openings is getting smaller.

There has been great progress in the development of DRAM integrated circuits over the recent years. The stacked capacitor has been particularly improved so as to maintain the desired capacitance while still reducing the dimensions of the cell array. Examples of improvements in stacked capacitors can be understood by reference to U.S. Pat. No. 5,110,752 by C. Y. Lu and to U.S. Pat. No. 5,126,916 to H. H. Tseng.

However, with this important DRAM progress in the cell array portion of the integrated circuit there have resulted problems, particularly in the peripheral circuits wherein the needs of the cell array for interlevel dielectric compositions between the metallurgy levels have impacted the etching of electrical contact openings. The preferred interlevel dielectric has become a first layer of silicon oxide and a second layer of borophosphosilicate glass (BPSG). The BPSG is used so that it can be flowed at reasonably high temperatures for planarization and to round sharp corners at, for example contact openings. Where there are two levels of interlevel dielectric layer, as is common over the peripheral circuits etching of contact openings at smaller feature sizes have become unsatisfactory due to surface tension bulges of the BPSG layers. This results in negative slope in the etched openings which in turn makes it nearly impossible to completely fill the openings with metal conductor material using the simple and preferred metal deposition processes, such as sputtering.

It is an object of this invention to provide methods to overcome the DRAM peripheral circuit contact opening negative slope problem without using complex metallurgy or etching processes.

It is a further object of this invention to provide a method which improves the etching of electrical contact openings in the peripheral circuits of a DRAM structure by critically specifying the order of layers within the two interlevel dielectric layers through which the contact openings are to be etched.

SUMMARY OF THE INVENTION

In accordance with the above objects, a method for etching contact openings through first and second interlevel dielectric layers covering the peripheral circuits of a DRAM integrated circuit to be electrically contacted in a semiconductor wafer is described. There is provided within and over the semiconductor wafer DRAM integrated circuit including peripheral circuits to be electrically contacted. A first conductive layer is formed over the DRAM integrated circuit and the layer is patterned. A first interlevel dielectric layer is formed over the first conductive layer which has been patterned. The first interlevel layer is composed of in the order from the first conductive layer of a silicon oxide layer and a borophosphosilicate layer. A second conductive layer is formed over the first interlevel dielectric layer and the second conductive layer is patterning said second conductive layer. A second interlevel dielectric layer is formed over the exposed second conductive layer and first interlevel dielectric. The second interlevel layer is composed of in the order from the second conductive layer of a borophosphosilicate layer and a silicon oxide layer. The openings through the first and second interlevel dielectric layers are etched to electrically contact regions in the peripheral circuits. The result due to the order of the interlevel dielectric layers the openings have an improved and positive slope characteristic.

The etching process used may be a one of two step process. Anisotropic etching is used in the one step process. In the two step etching process, isotropic etching is used to etch through the silicon oxide layer and into the topmost layer of BPSG and then anisotropic etching step is used to complete the etching of the openings to the peripheral circuit regions to be contacted. A special anisotropic etching characteristic of preferential etching of the BPSG over the silicon oxide gives the desired positive slope characteristic of the openings.

BRIEF DESCRIPTION OF THE DRAWINGS

FIG. 2 and FIG. 3 are cross-sectional, schematic illustrations of the contact openings which aid in the understanding of the one step etching method of the present invention as seen in FIG. 3 as compared to that of the Prior Art as seen in FIG. 2.

FIG. 4 and FIG. 5 are cross-sectional, schematic illustrations of the contact openings which aid in the understanding of the two step etching method of the present invention as seen in FIG. 5 as compared to that of the Prior Art as seen in FIG. 4.

BRIEF DESCRIPTION OF THE PREFERRED EMBODIMENTS

Figure 1:
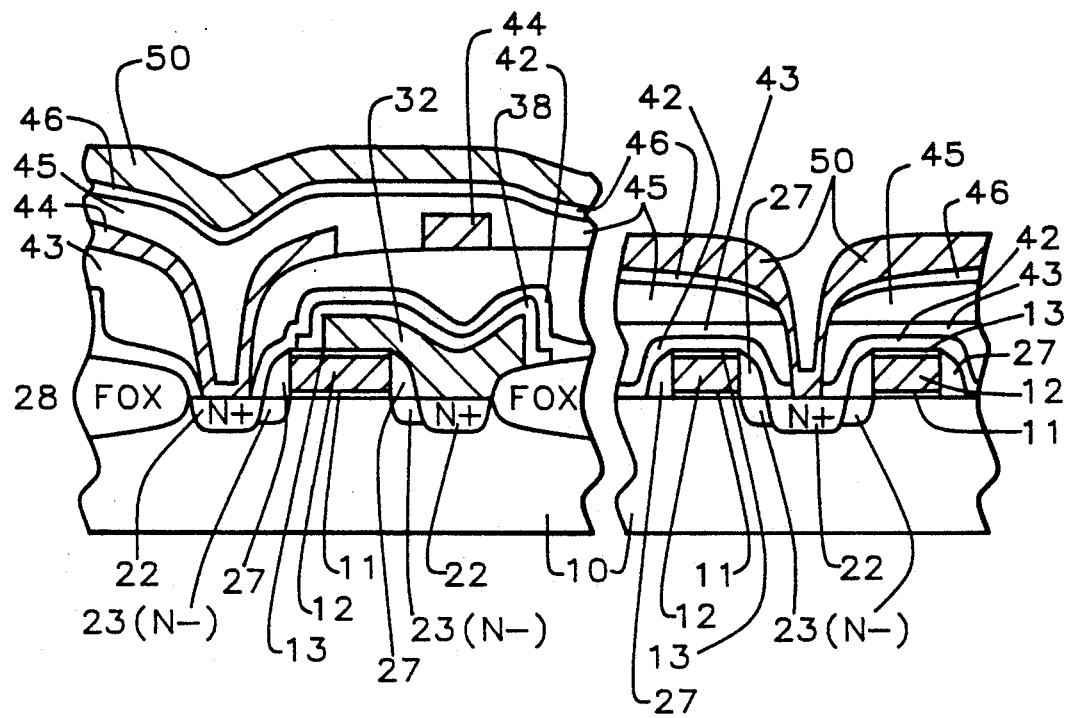
FIG. 1 is a cross-sectional, schematic drawing showing the resulting structure of the metal filled openings in the peripheral circuit portions of the DRAM integrated circuit of the present invention.

Referring now to FIG. 1, there is illustrated the new DRAM process and structure having a desired peripheral contact opening structure. The first series of steps to form this structure involves the formation of the dielectric isolation regions for isolating semiconductor surface regions from other such regions in the semiconductor substrate 10. The semiconductor substrate is preferably composed of P type silicon having a (100) crystallographic orientation. In an effort to simplify the description and the drawings the dielectric isolation between devices has been only partially shown and will not be described in detail, because they are conventional. For example, one method is described by E. Kooi in his U.S. Pat. No. 3,970,486 wherein certain selected surface portions of a silicon semiconductor substrate is masked against oxidation, and then the exposed unmasked surface is oxidized to grow a thermal oxide which in effect sinks into the silicon surface at the unmasked areas. The masked silicon remains as a mesa surrounded by the sunken silicon dioxide or Field Oxide pattern, FOX 28. Then semiconductor devices can be provided in the silicon mesas according to the following processes.

The surface of the silicon substrate 10 is thermally oxidized to form the desired gate oxide 11 thickness. The preferred thickness is between about 80 to 200 Angstroms. The polysilicon layer 12 is blanket deposited by LPCVD (Low Pressure Chemical Vapor Deposition) method. The preferred thickness of the polysilicon layer 12 is between about 2000 to 4000 Angstroms. The polysilicon layer 12 is ion implanted with phosphorous or arsenic ions under the conditions 5 to 10 E 15 dosage atoms per $CM^2$ and 20 to 60 Kev. or doped with phosphorus oxychloride at a temperature about 900° C. The surface of the layer is either thermally oxidized or a chemical vapor deposition process to form silicon oxide layer 13. The layers 11, 12 and 13 are patterned by conventional lithography and anisotropic etching techniques as are conventional in the art to provide a desired pattern of gate electrodes and structure on the FOX 28 surfaces or elsewhere as seen in FIG. 1.

The source/drain structure of the MOS FET may now be formed by the following steps. The FIG. 1 illustrates the formation of an N channel FET integrated circuit device. However, it is well understood by those skilled in the art that a P channel FET integrated circuit device could also be formed by simply substituting opposite polarities to those given for the N channel embodiment. Also, a CMOS FET could in a similar way be formed by making both N channel and P channel devices upon the same substrate.

FIG. 1, for example shows the ion implantations of Ndopants. Lithographic masks may be required to protect the areas not to be subjected to that particular N- ion implantation. The formation of the lithographic masks are done by conventional lithography and etching techniques. The N— lightly doped drain implantation 23 are done with, for example phosphorous P31 at a dose of between about 1 to 10 E 13 atoms/cm.$^2$ and with an energy of between about 20 to 40 Kev.

The dielectric spacer 27 is now to be formed followed by the completion of the lightly doped drain source/drain structures. A low temperature silicon oxide deposition is preferred such as through the chemical vapor deposition of tetraethoxysilane (TEOS) at a temperature in the range of between about 650° to 900° C. Other silicon oxide deposition methods include silane based LPCVD. The thickness of the dielectric silicon dioxide layer 27 is between about 2000 to 5000 Angstroms and preferably about 2500 Angstroms.

An anisotropic etching of this layer produces the dielectric spacer layer 27 on the sidewalls of the layer structures 11, 12, 13. The preferred anisotropic etching uses a conventional reactive ion etching ambient.

Figure 2:
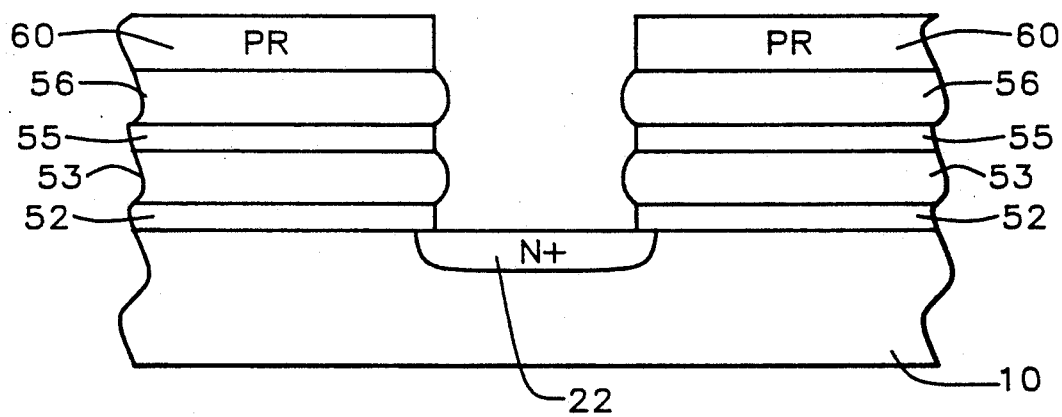

The N+ source/drain ion implantation uses Arsenic, As75 with a dose of between about 2 E 15 to 1 E 16 atoms/cm.$^2$ and energy of between about 20 to 70 Kev. to complete the source/drain regions 22 of the N channel lightly doped drain MOS FET integrated circuits device as seen in the FIG. 2.

The capacitor structure is fabricated by depositing a polycrystalline silicon layer 32 for the capacitor node over the surface of the substrate 10 using the same deposition techniques described in regard to polycrystalline silicon layer 12. The thickness of the first layer is typically between about 3000 to 6000 Angstroms. An impurity is introduced into the first layer, either by ion implantation techniques or in situ doping. The impurity concentration in this first layer 32 is preferably between about $10^{18}$ to $10^{21}$ atoms per $CM.^3$.

A thin dielectric layer 38 is deposited. This layer serves as the capacitor dielectric. The thin dielectric or insulating layer has a thickness that is preferably in the range of about 30 to 250 Angstroms. The material of the dielectric layer can be of any suitable material having a high dielectric constant, and which forms a continuous, pinhole free layer. Preferably the dielectric layer is a composite layer of a silicon oxide-silicon nitride-silicon oxide (ONO) with a total thickness of between about 40 to 150 Angstroms. Alternatively, and of particular importance for the future is the dielectric tantalum oxide, such as tantalum pentoxide or in combination with silicon dioxide and/or silicon nitride.

As shown in FIG. 1, a first conductive layer 40, such as polycrystalline silicon or the like is deposited over layer 38 and patterned to serve as the second or plate electrode. Also, the polysilicon layer 40 is patterned by lithography and etching techniques. The polycrystalline silicon layer 32 is the storage node of the capacitor. The polycrystalline silicon layer 40 is also doped with an impurity, preferably with a concentration in the range of about $10^{18}$ to $10^{21}$ atoms per $CM.^3$.

The completion of the electrical contacts to the monocrystalline silicon regions such as the bit line 44 contact to source regions 22 is now conventionally accomplished. Insulating first interlevel dielectric layer structure is composed of, for example a first layer 42 of silicon dioxide and a second much thicker layer 43 of borophosphosilicate glass, phosphosilicate glass or similar insulating layer. The operational thicknesses of these layers are between about 500 to 1500 Angstroms for the oxide layer and between about 2500 to 3500 or more Angstroms for the glasseous layer. The preferred total thickness of the first interlevel dielectric layer is between about 3000 to 5000 Angstroms. These layers are typically deposited by chemical vapor deposition in low pressure or atmospheric pressure, or in a plasma enhanced reactive chamber.

The contact windows or openings are now formed through the insulating layered structure to the source regions 24 or the like in the device regions. The openings are not shown to the other regions at this time. This process step is conventionally done by lithography and etching techniques which preferably use a reactive ion etching process that will anisotropically etch both components of the interlevel dielectric layer structure 42, 43. A typical reactive ion etching process using fluorine containing etching chemical species. These oxide/glass layers etching processes are well known to those in the art. The size of the contact window opening can be as small as limitation of the etching and lithography patterning capability.

A second conductive polysilicon, metal or composite metal layer or polycide composite layer (such as tungsten polycide) 44 is deposited over the exposed device region 24 and the interlevel dielectric structure 42, 43 both above and on the sides of the opening. This layer will be the bit line contact. This layer may be deposited by, for example chemical vapor deposition or sputtering. The operational thickness is between about 2000 to 10,000 Angstroms and the preferred thickness is between about 5000 to 7000 Angstroms. The thickness of this layer 44 is dependant upon the height and profile of the contact hole. The second conductive layer 44 is patterned by conventional lithography and etching.

A second interlevel dielectric insulating layer is formed over the exposed patterned second conductive layer (bit line) 44, and the remaining first interlevel dielectric layer. This second interlevel dielectric layer is a critically formed layer for the present invention. It is a composite layer of, for example in the order of its deposition a first layer 45 of borophosphosilicate glass and a second layer 46 of silicon oxide. The total thickness of this second interlevel dielectric layer is between about 2500 to 5000 Angstroms. The thickness of the borophosphosilicate glass is between about 2000 to 3500 Angstroms and the thickness of the silicon oxide is between about 500 to 1500 Angstroms.

The first layer 45 of borophosphosilicate glass (BPSG) is deposited preferably by low pressure chemical vapor deposition (LPCVD) of tetraethoxysilane (TEOS) doped with phosphine ($PH_3$) and trimethylborate (($CH_3$)3B), in oxygen. The borophosphosilicate glass in both the first and second interlevel dielectric layers has a composition of 3.5 to 5.0 wt. % (weight %) boron and 3.0 to 4.5 wt. % phosphorus. Other BPSG deposition methods include silane-based LPCVD. The BPSG is then flowed at temperatures between about 850° to 900° C. for between about 5 to 30 minutes in nitrogen.

The critical etching step is now used to form contact openings in the peripheral circuit areas having the desired positive slope characteristics. Openings are made through the first and second interlevel dielectric layers 42, 43, 45, 46 by lithography and etching techniques. A one step anisotropic etching process or a two step isotropic and anisotropic etching process can be alternatively used.

Referring now more particularly to FIGS. 2 and 3, we see the comparison between the Prior Art FIG. 2 etched opening and the present invention's FIG. 3 etched opening by the one step anisotropic etching process while using the etching mask 60. The order of interlevel dielectric layers in certain Prior Art processes is to use a silicon oxide undoped) layer 52 and a borophosphosilicate glass layer 53 for the first interlevel dielectric; and a silicon oxide (undoped) layer 55 and a borophosphosilicate glass layer 56 for the second interlevel dielectric as seen in FIG. 2. The result of this single step anisotropic etching process is a bulging of the BPSG layers 53 and 56. This bulging gives a negative slope that makes it difficult to completely fill the openings by conventional metallurgy deposition methods. Further, when a dip etch is used to remove the native silicon oxide from the bottom of the openings just before the metallurgy deposition, there is a nonuniform etching of the exposed BPSG and the silicon oxide layers. This nonuniform etching adds to the negative slope problem.

Referring now to FIG. 3, in the present invention the BPSG layers 43 and 45 are formed to be contiguous with each other and the silicon oxide layers 42, 46 are formed to be above and below the BPSG layers. This is against all known teaching in the art, because it is always desired to have the BPSG as the top layer so that after contact openings are formed, a heating step is used to cause the flow of the EPSG and the rounding of the top of the openings. Further, and very critical to the success of the anisotropic process the etching process specie and conditions are chosen to have the BPSG etch at a slightly faster rate than the silicon oxide. This etching process overcomes the bulging problem of the Prior Art. Also, the dip etching of the native silicon oxide will preferably etch the silicon oxide and will not present a problem. The preferred etching specie for the preferential etching of the BPSG over the silicon oxide is hydrofluoric acid (HF) and the conditions of the anisotropic etching process are dry etching. The etching ratios are about 1 (ratio of etching BPSG vs SiO2). The preferred dip etching of the native silicon oxide is $HF:NH_4F:H_2O$ under the conditions 1:1:20.

Referring now more particularly to FIGS. 4 and 5, we see the comparison between the Prior Art FIG. 4 etched opening and the present invention's FIG. 5 etched opening by the two step isotropic and then anisotropic etching process. The order of interlevel dielectric layers in certain Prior Art processes is to use a silicon oxide (undoped) layer 52 and a borophosphosilicate glass layer 53 for the first interlevel dielectric; and a silicon oxide (undoped) layer 55 and a borophosphosilicate glass layer 56 for the second interlevel dielectric as seen in FIG. 4. A photoresist mask 60 is shown to aid in the formation of the opening as is known in the art. The result of this two step isotropic and anisotropic etching process is the nonuniform anisotropic etching of the BPSG layers 53 and 56 and silicon oxide layer 52 and 55. This bulging of the silicon oxide layers (as shown for example) gives a negative slope that makes it difficult to completely fill the openings by conventional metallurgy deposition methods. Further, when a dip etch is used to remove the native silicon oxide from the bottom of the openings just before the metallurgy deposition, there is another nonuniform etching of the exposed BPSG and the silicon oxide layers. This nonuniform etching adds to the negative slope problem.

Referring now to FIG. 5, in the present invention the BPSG layers 43 and 45 are formed to be contiguous with each other and the silicon oxide layers 42, 46 are formed to be above and below the BPSG layers as described in FIG. 3 above. A photo resist mask 60 is shown as formed over the silicon oxide layer 46. The isotropic etching step causes the sloped undercut etching as seen into layers 46 and 45. The process is ended before passing through layer 45. Then the anisotropic etching step is begun. As in the one step anisotropic process above, it is critical to the success of the anisotropic process that the etching process specie and conditions are chosen to have the BPSG etch at a slightly faster rate than the silicon oxide. This etching process overcomes the negative slope problem of the Prior Art FIG. 4. Under these conditions the layer 42 will slightly extend within the opening, but this does not present a problem for metallurgy filling of the openings. Also, the dip etching of the native silicon oxide will preferably etch the silicon oxide and will not present a problem. The preferred etching specie for the preferential anisotropic etching of the BPSG over the silicon oxide and the dip etching process are the same as described above with regard to the FIG. 3 process. The preferred isotropic etching process uses hydrofluoric acid specie and is $HF:NH_4F:H_2O$ under the conditions 1:1:20.

The metallurgy 50, which is typically aluminium, aluminum/silicon, tungsten or aluminum/silicon/copper, is then deposited by conventional and well understood evaporation, sputtering, chemical vapor deposition or the like and patterned using lithography and etching techniques to produce the final structure shown in FIG. 1.

While the invention has been particularly shown and described with reference to the preferred embodiments thereof, it will be understood by those skilled in the art that various changes in form and details may be made without departing from the spirit and scope of the invention.

What is claimed is:

1. The method for etching contact openings through first and second interlevel dielectric layers covering the peripheral circuits of a DRAM integrated circuit to be electrically contacted in a semiconductor wafer comprising:

providing within and over said semiconductor wafer said DRAM integrated circuit including said peripheral circuits to be electrically contacted;

forming a first conductive layer over said DRAM integrated circuit and patterning said layer;

forming a first interlevel dielectric layer over said first conductive layer which has been patterned, said first interlevel layer being composed of in the order from the first conductive layer of a silicon oxide layer and a borophosphosilicate layer;

forming a second conductive layer over said first interlevel dielectric layer and patterning said second conductive layer;

forming a second interlevel dielectric layer over said exposed second conductive layer and first interlevel dielectric, said second interlevel layer being composed of in the order from the second conductive layer of a borophophosilicate layer and a silicon oxide layer; and etching said openings through said first and second interlevel dielectric layers to electrically contact regions in said peripheral circuits whereby due to the order of said interlevel dielectric layers said openings have an improved slope characteristic.

2. The method of claim 1 wherein said etching is a one step anisotropic etching process which has been chosen to preferentially etch said borophosphosilicate layers over said silicon oxide layers.

3. The method of claim 2 wherein said etching process uses dry etching in an ambient of oxygen ($O_2$), carbon hydrogen trifluoride ($CHF_3$), and carbon tetrafluoride $CF_4$).

4. The method of claim 1 and further comprising filling said openings with aluminum metal to electrically contact said regions in said semiconductor wafer.

5. The method of claim 4 wherein said aluminum metal is deposited by a sputtering process.

6. The method of claim 1 wherein said first interlevel dielectric layer has a total thickness of between about 3000 to 5000 Angstroms, said second interlevel dielectric layer has a total thickness of between about 2500 to 5000 Angstroms, said silicon oxide layers in said first and second interlevel dielectrics have a thickness of between about 500 to 1500 Angstroms, and said borophosphosilicate layers have a thickness of between about 2000 to 3500 Angstroms.

7. The method of claim 1 wherein said etching is a two step having a first isotropic etching step to form a sloped opening in said silicon oxide and borophophosilicate layers of said second interlevel dielectric layer and a second anisotropic etching step which has been chosen to preferentially etch said borophosphosilicate layers over said silicon oxide layers.

8. The method of claim 7 wherein said anisotropic etching process uses dry etching in an ambient of oxygen ($O_2$), carbon hydrogen trifluoride ($CHF_3$), and carbon tetrafluoride $CF_4$).

9. The method for etching contact openings to the peripheral circuit regions of a DRAM integrated circuit having a cell array composed of MOSFET devices and associated capacitors, and peripheral circuits comprising:

forming in one portion of a semiconductor wafer said cell array of MOSFET devices and associated capacitors; forming in a second portion of said semiconductor wafer said peripheral circuits;

forming a first conductive layer over said cell array and said peripheral circuits, and patterning said layer;

forming a first interlevel dielectric layer over said conductive layer which has been patterned, said first interlevel layer being composed of in the order from the first conductive layer of a silicon oxide layer and a borophosphosilicate layer;

forming a second conductive layer over said first interlevel dielectric layer and patterning said second conductive layer;

forming a second interlevel dielectric layer over said exposed second conductive layer and first interlevel dielectric, said second interlevel layer being composed of in the order from the second conductive layer of a borophophosilicate layer and a silicon oxide layer; and etching said openings through said first and second interlevel dielectric layers to electrically contact regions in said peripheral circuits whereby due to the order of said interlevel dielectric layers said openings have an improved slope characteristic.

10. The method of claim 9 wherein said etching is a one step anisotropic etching process which has been chosen to preferentially etch said borophosphosilicate layers over said silicon oxide layers.

11. The method of claim 10 wherein said etching process uses $HF:NH_4F:H_2O$ under conditions 1:1:20.

12. The method of claim 9 and further comprising filling said openings with aluminum metal to electrically contact said regions in said semiconductor wafer.

13. The method of claim 12 wherein said aluminum metal is deposited by a sputtering process.

14. The method of claim 9 wherein said first interlevel dielectric layer has a total thickness of between about 3000 to 5000 Angstroms, said second interlevel dielectric layer has a total thickness of between about 2500 to 5000 Angstroms, said silicon oxide layers in said first and second interlevel dielectrics have a thickness of between about 500 to 1500 Angstroms, and said borophosphosilicate layers have a thickness of between about 2000 to 3500 Angstroms.

15. The method of claim 9 wherein said etching is a two step having a first isotropic etching step to form a sloped opening in said silicon oxide and borophophosilicate layers of said second interlevel dielectric layer and a second anisotropic etching step which has been chosen to preferentially etch said borophosphosilicate layers over said silicon oxide layers.

16. The method of claim 15 wherein said anisotropic etching process uses dry etching in an ambient of oxygen ($O_2$), carbon hydrogen trifluoride ($CHF_3$), and carbon tetrafluoride $CF_4$).

* * * * *